US009450137B2

(12) United States Patent
Krause et al.

(10) Patent No.: US 9,450,137 B2
(45) Date of Patent: Sep. 20, 2016

(54) APPARATUS AND METHOD FOR MOUNTING CONTACT WIRES ON SOLAR CELL WAFERS

(71) Applicant: Schmid Technology Systems GmbH, Niedereschach (DE)

(72) Inventors: Benjamin Krause, Aichhalden (DE); Christoph Ponisch, Freudenstadt (DE); Gunter Itta, Villingen-Schwenningen (DE); Martin Seifried, Rottweil (DE)

(73) Assignee: Schmid Technology Systems GmbH (DE)

( * ) Notice: Subject to any disclaimer, the term of this patent is extended or adjusted under 35 U.S.C. 154(b) by 0 days.

(21) Appl. No.: 14/442,617

(22) PCT Filed: Nov. 13, 2013

(86) PCT No.: PCT/EP2013/073736
§ 371 (c)(1),
(2) Date: May 13, 2015

(87) PCT Pub. No.: WO2014/076134
PCT Pub. Date: May 22, 2014

(65) Prior Publication Data
US 2016/0155887 A1 Jun. 2, 2016

(30) Foreign Application Priority Data
Nov. 14, 2012 (DE) .......................... 10 2012 220 815

(51) Int. Cl.
*H01L 31/18* (2006.01)
*H01L 31/05* (2014.01)

(52) U.S. Cl.
CPC ......... *H01L 31/188* (2013.01); *H01L 31/0504* (2013.01); *Y02E 10/50* (2013.01)

(58) Field of Classification Search
CPC ............. H01L 31/0504; H01L 31/188; H01L 21/67138

USPC .......................................................... 438/62
See application file for complete search history.

(56) References Cited

U.S. PATENT DOCUMENTS

| 4,430,519 A * | 2/1984 | Young .................. H01L 31/188 136/244 |
| 8,967,222 B2 | 3/2015 | Abe et al. |
| 9,076,922 B2 | 7/2015 | Kutzer et al. |

(Continued)

FOREIGN PATENT DOCUMENTS

| DE | 10 2011 081 674 A1 | 2/2013 | |
| WO | 96/17387 A1 | 6/1996 | |
| WO | WO9617387 * | 6/1996 | ............. H01L 31/05 |

OTHER PUBLICATIONS

International Search Report issued in connection with corresponding PCT/EP2013/073736.
German Search Report issued in connection with corresponding German Application No. 10 2012 220 815.1.

(Continued)

*Primary Examiner* — Caridad Everhart
(74) *Attorney, Agent, or Firm* — Akerman LLP

(57) ABSTRACT

A device and a method for fitting solar cell contact wires providing a series connection, and which run continuously in a string direction to join a front solar cell wafer and a rear solar cell wafer.

Figure 1:
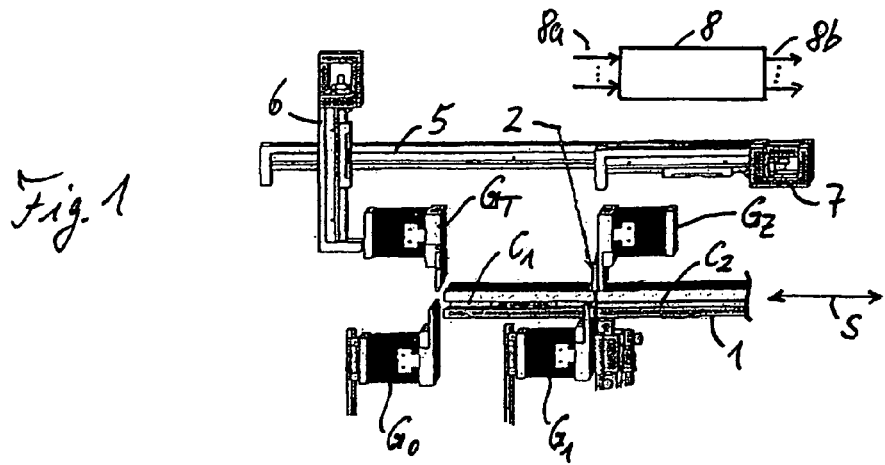

The device includes a wire-laying mechanism having a wire feed gripper, a wire transport gripper movable in the string direction relative to the wire feed gripper, a wire-holding gripper to grip and hold the contact wires behind the wafer-holding position for the rear solar cell wafer, and a wire cutter. Once a front solar cell wafer has been positioned, the contact wires are transferred from the wire feed gripper to the wire transport gripper, are advanced in the string direction over the wafer-holding position, are gripped and held by the wire-holding gripper, and are then cut behind the wire-holding gripper by the wire cutter.

10 Claims, 6 Drawing Sheets

(56) References Cited

U.S. PATENT DOCUMENTS

2006/0219352 A1 10/2006 Micciche
2011/0253191 A1 10/2011 Kutzer et al.
2012/0077302 A1 3/2012 Abe et al.

OTHER PUBLICATIONS

Chinese Office Action issued in connection with corresponding Chinese Patent Application No. 201380059568.4.

* cited by examiner

APPARATUS AND METHOD FOR MOUNTING CONTACT WIRES ON SOLAR CELL WAFERS

This application is a national phase of PCT/EP2013/073736, filed Nov. 13, 2013, and claims priority to DE 10 2012 220 815.1, filed Nov. 14, 2012, the entire contents of which are hereby incorporated by reference.

The invention relates to a device and a method for fitting solar cell contact wires providing a series connection, said contact wires running continuously in a string direction on an upper side of a front solar cell wafer and an underside of a rear solar cell wafer following the front solar cell wafer in a solar cell string to be formed.

It is known to electrically connect in series a plurality of solar cell wafers, also referred to in the present case as wafers for short, with formation of what is known as a solar cell string, by electrically contacting the upper side of a solar cell wafer with the underside of a subsequent solar cell wafer in the string by means of contact wires. In this case, the term solar cell wafer is presently to be understood to mean any conventional arrangement of one or more photovoltaic cells integrated on a wafer, said arrangement having corresponding connections on the upper side and underside, typically in the form of front contact and rear contact structures, which may include punctiform and/or linear structural elements. The terms upper side and underside are to be understood presently in this case to mean generally the two main sides of the solar cell wafer, of which one side acts as a front contact side or incident light side and the other side acts as a rear contact side without specification of a specific spatial position.

In the prior German patent application 102011081674.7 in the name of the applicant, a method and a device of the type mentioned in the introduction are described. The device comprises a wafer-holding device, on which the solar cell wafers can be positioned in succession in the string direction in respective wafer-holding positions, and a wire-laying mechanism, which has a wire guide arranged movably above the wafer-holding device, said wire guide comprising a respective wire cutter, and also a wire-holding gripper mechanism comprising wire grippers in each case between the wafer-holding positions and also in front of the foremost and behind the rearmost wafer-holding position. Before a wafer that is arranged to the front in the string is positioned, the wafer-holding position of said wafer is first overlaid by the contact wires. To this end, the wire guide with the parallel contact wires to be laid down moves towards the wire-holding gripper behind the wafer-holding position, transfers the contact wire ends thereto and then moves towards the wire-holding gripper in front of the wafer-holding position, transfers the wires thereto and cuts off the wires. The foremost, first wafer is then placed in its holding position, such that the contact wires laid down beforehand bear against the underside of the wafer. The contact wires are then fitted on the upper side of the foremost wafer and on the underside of the next wafer so as to connect said wafers in series. To this end, the wire guide moves towards the wire-holding gripper behind the wafer-holding position for the second wafer, transfers the contact wires thereto and then moves until in front of the foremost wafer. A hold-down device is then placed on the upper side of the first wafer with the contact wires pulled tight thereover and holds the contact wires there in position. The contact wires are then cut off by the wire cutter on the wire guide, and the second wafer is placed in its holding position overlaid by the contact wires. The wafer-holding device then advances by a holding position, and the described contact wire laying process is carried out with the next wafer pair, that is to say in order to lay down the contact wires on the upper side of the second wafer and the underside of the next, third wafer. In this method, the wire guide consequently initially moves forward by two wafer lengths, that is to say rearwards in the string direction, in order to transfer the contact wire ends to the respective wire-holding gripper, and then back again by two wafer lengths, that is to say forwards in the string direction, in order to tension the contact wires over the holding position of the next wafer, which is not yet positioned, and the upper side of the positioned, front wafer, the wire guide guiding the contact wires in each case.

Laid-open specification DE 102010016476 A1 discloses a method and a device for applying contact wires to a surface of a photovoltaic cell with use of a positioning and depositing arrangement which comprises a plurality of nozzles or eyes, wherein in each case at least one contact wire is guided through the respective nozzle or eye in order to be positioned and laid on the surface of the photovoltaic cell.

It is an object of the invention to provide a device and a method of the type mentioned in the introduction, which, compared to the above-explained prior art, enable improved fitting of the solar cell contact wires, which provide a series connection, on the upper side and underside respectively of two adjacent solar cell wafers of a solar cell string to be formed.

The invention achieves this object by the provision of a device for fitting solar cell contact wires providing a series connection, said contact wires running continuously in a string direction on an upper side of a front solar cell wafer and an underside of a rear solar cell wafer following the front solar cell wafer in a solar cell string to be formed, said device comprising a wafer-holding device, on which the solar cell wafers can be positioned in succession in the string direction in respective wafer-holding positions, a wire-laying mechanism having a wire feed gripper and a wire transport gripper movable in the string direction relative to the wire feed gripper, the grippers being arranged above the wafer-holding device, a wire-holding gripper which is designed to grip and to hold the contact wires behind the wafer-holding position for the rear solar cell wafer, and a wire cutter, and a wire-laying control device, which controls the wire-laying mechanism to carry out a wire-laying procedure, in which, once the front solar cell wafer has been positioned in its respective wafer-holding position and before the rear solar cell wafer has been positioned in its respective wafer-holding position, the contact wires are transferred from the wire feed gripper to the wire transport gripper, are advanced by the wire transport gripper in the string direction over the wafer-holding position for the rear solar cell wafer and over the upper side of the positioned front solar cell wafer, are gripped and held by the wire-holding gripper behind the wafer-holding position for the rear solar cell wafer, and are then cut off behind the wire-holding gripper by the wire cutter.

The invention further achieves this object by providing a method for fitting solar cell contact wires providing a series connection, said contact wires running continuously in a string direction on an upper side of a front solar cell wafer and an underside of a rear solar cell wafer following the front solar cell wafer in a solar cell string to be formed, said method comprising the following steps: positioning the front solar cell wafer in a respective wafer-holding position of a wafer-holding device, transferring the contact wires from a wire feed gripper arranged above the wafer-holding device to a wire transport gripper, advancing the contact wires through the wire transport gripper in the string direction over a wafer-holding position for the rear solar cell wafer and over the upper side of the positioned front solar cell wafer, gripping and holding the contact wires behind the wafer-holding position for the rear solar cell wafer by means of a wire-holding gripper and behind the wire-holding gripper by means of the wire feed gripper, cutting off the contact wires behind the wire-holding gripper and in front of the wire feed gripper by means of a wire cutter, and positioning the rear solar cell wafer in its respective wafer-holding position.

Advantageous developments of the invention are specified in the dependent claims, of which the wording is hereby incorporated by reference into the description so as to avoid unnecessary repetition of text.

The device according to the invention comprises a wafer-holding device, on which the solar cell wafers can be positioned in succession in the string direction in respective wafer-holding positions, and a wire-laying mechanism. The wire-laying mechanism includes a wire feed gripper and a wire transport gripper movable in the string direction relative to the wire feed gripper, the grippers being arranged above the wafer-holding device, and also a wire-holding gripper for gripping and holding the contact wires behind the wafer-holding position for the rear solar cell wafer, and a wire cutter. In order to provide the upper side of a front solar cell wafer and the underside of a subsequent solar cell wafer with the continuous contact wires connecting said wafers in series, corresponding wire-laying control means control the wire-laying mechanism in such a way that, once the front wafer has been positioned in its respective wafer-holding position and before the rear wafer has been positioned in its respective wafer-holding position, the contact wires are transferred from the wire feed gripper to the wire transport gripper and are advanced by the latter in the string direction over the wafer-holding position for the rear wafer and over the upper side of the positioned front wafer, that is to say are moved forwards along the solar cell string to be formed. Behind the wafer-holding position for the rear wafer, the contact wires are gripped and held by the wire-holding gripper. They can then be cut off behind the wire-holding gripper by the wire cutter. The rear solar cell wafer can then be positioned in its respective wafer-holding position. With this wire-laying kinematics according to the invention, the contact wires can be fitted in a very effective and functionally reliable manner continuously on the upper side of the front wafer and the underside of the subsequent rear wafer in order to connect the wafers in the string in series.

In a development of the invention, the transfer of the contact wires from the wire feed gripper to the wire transport gripper includes to have the wire feed gripper be controlled from a wire-clamping position into a wire release position, and the wire transport gripper be controlled from a wire release position into a wire-clamping position. In the wire-clamping position, the respective gripper holds the contact wires tightly, and in the wire release position it releases the wires, that is to say it lets them loose.

In a development of the invention, the contact wires are cut off at a point between the wire feed gripper and the wire-holding gripper, the wire feed gripper being controlled from a wire release position into a wire-clamping position before the contact wires are cut off. The wire feed gripper thus holds the contact wires tightly on the feed side for the cutting process. It may then transfer the wires back to the wire transport gripper in order to carry out the next contact wire laying process.

In an embodiment of the device according to the invention, the wire cutter is formed by two cutting plates displaceable with respect to one another in a plane-parallel manner, which are provided with cooperating wire feedthrough openings. The wire feedthrough openings in the feed-side cutting plate advantageously have a conically tapered shape.

In a development of the invention, the advanced contact wires are bent between the upper side of the front wafer and the wafer-holding position for the rear wafer by means of a wire bender from a level of the upper side of the front wafer to a level of the wafer-holding position for the rear wafer. A defined bend or kinked characteristic, for example, with an approximately Z-shaped course, can thus be achieved for the contact wires in this transition region between the two solar cell wafers to be electrically connected in series.

In a development of the invention, a hold-down device is placed on the upper side of the front wafer once the contact wires have been advanced. The hold-down device then holds the contact wires in position there. The wire transport gripper may accordingly release, that is to say let loose, the contact wires and can be moved back into a position for renewed contact wire transfer from the wire feed gripper.

Figure 2:
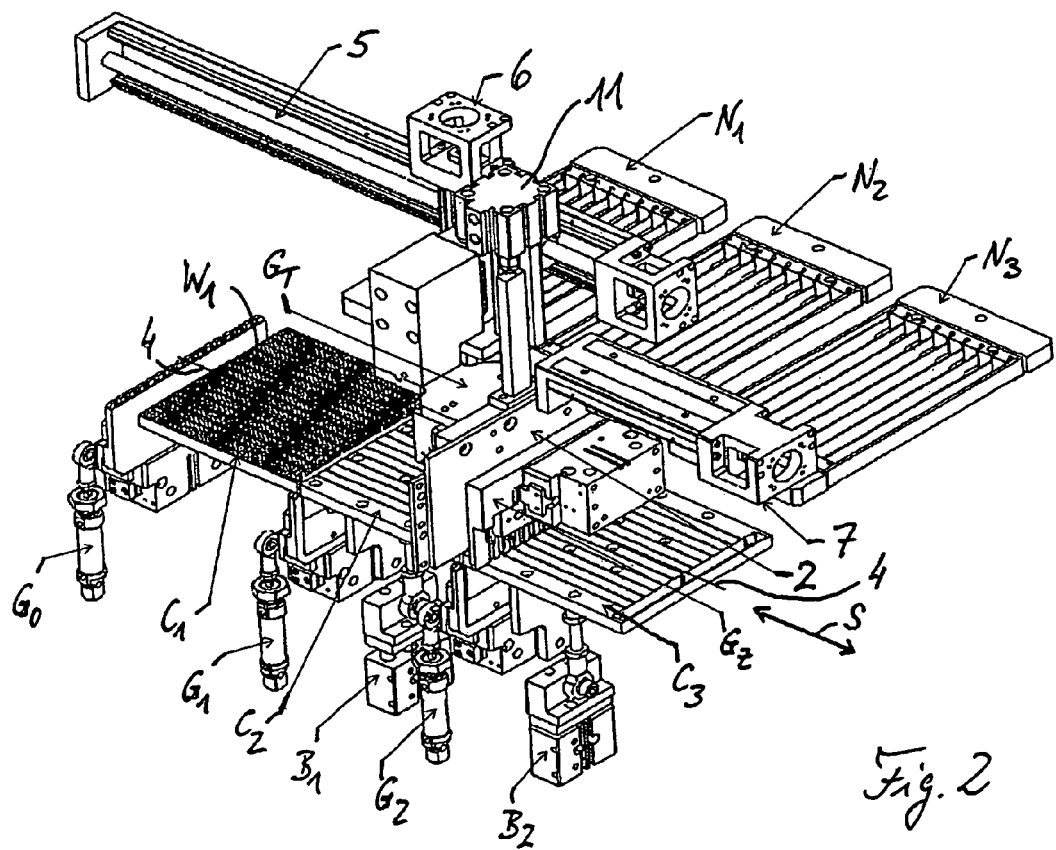
Figure 3:
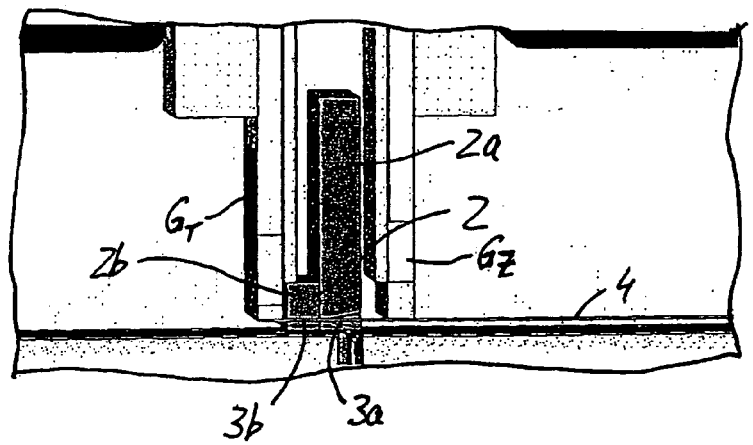
Figure 4:
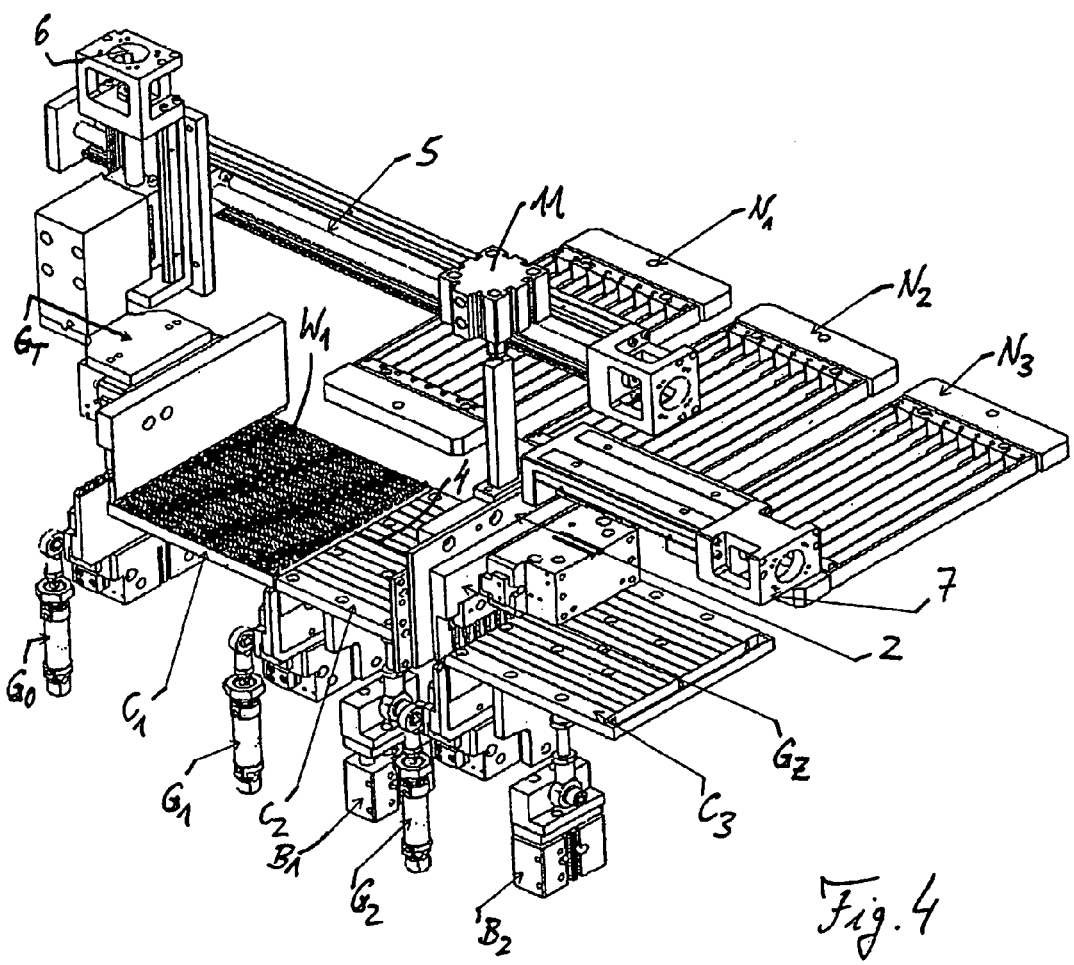
Figure 5:
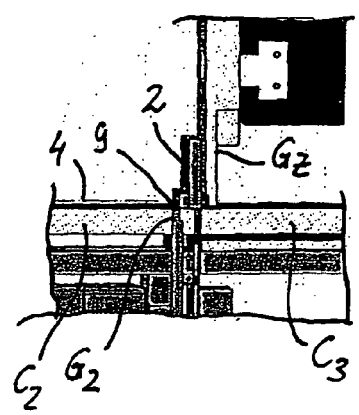
Figure 6:
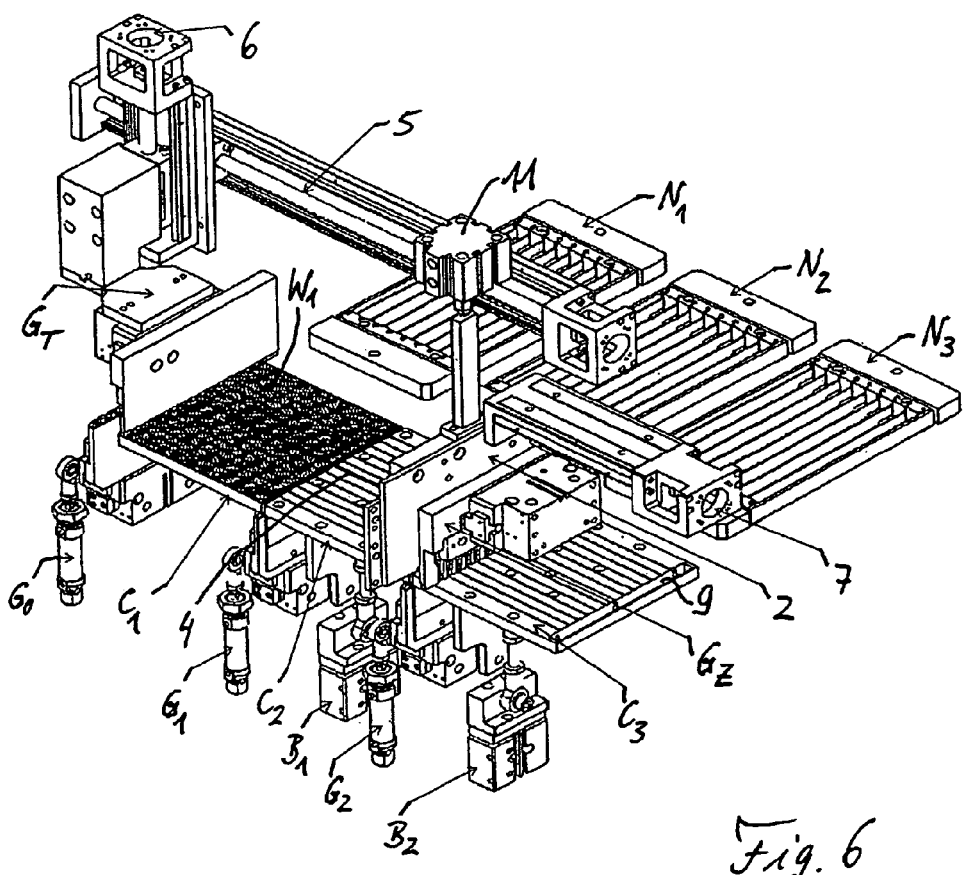
Figure 7:
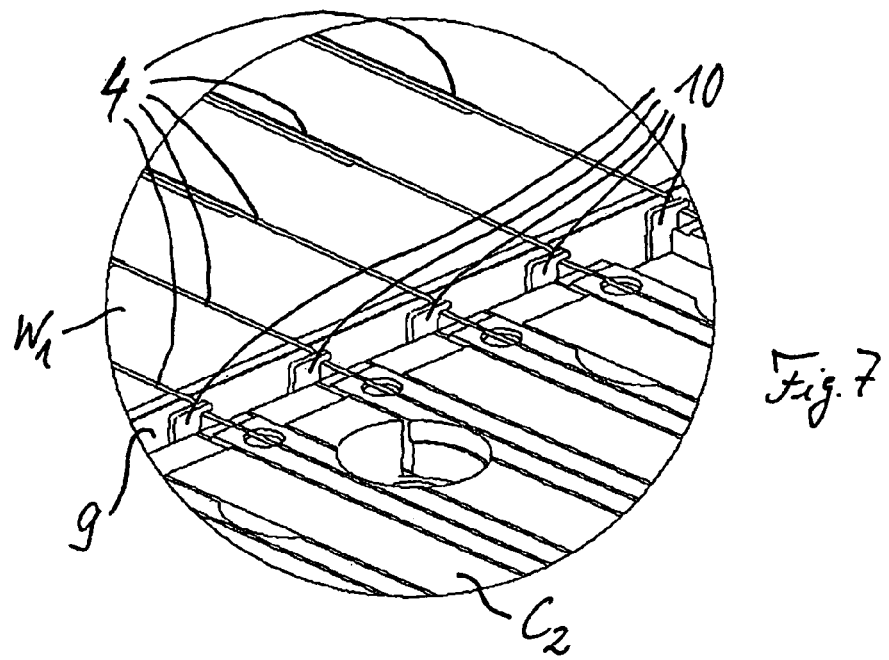
Figure 8:
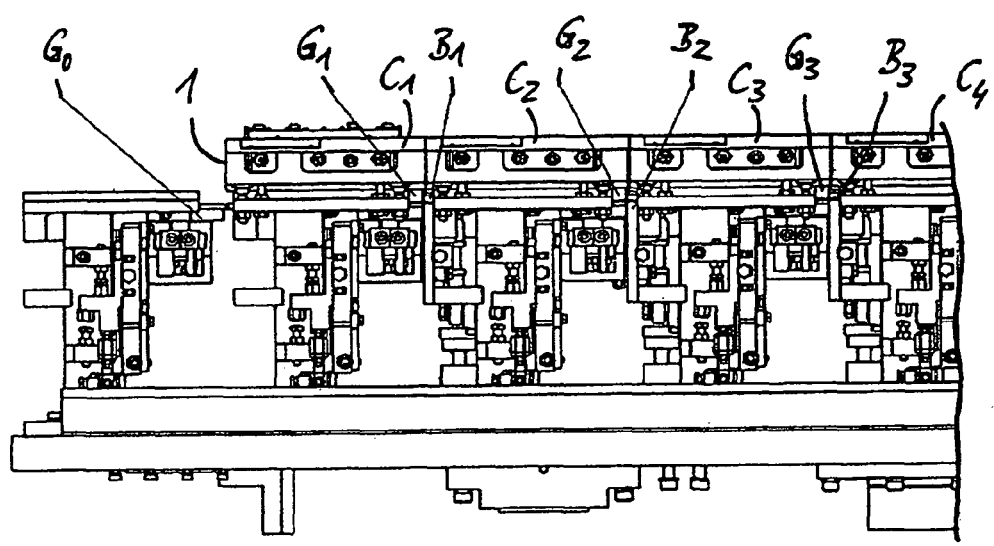
Figure 9:
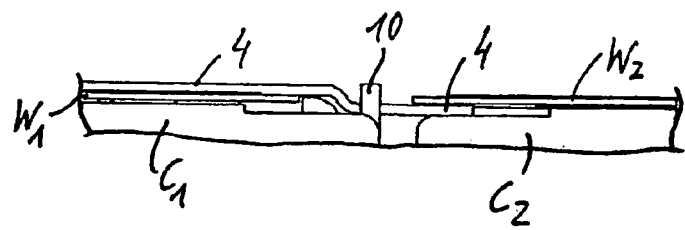
Figure 10:
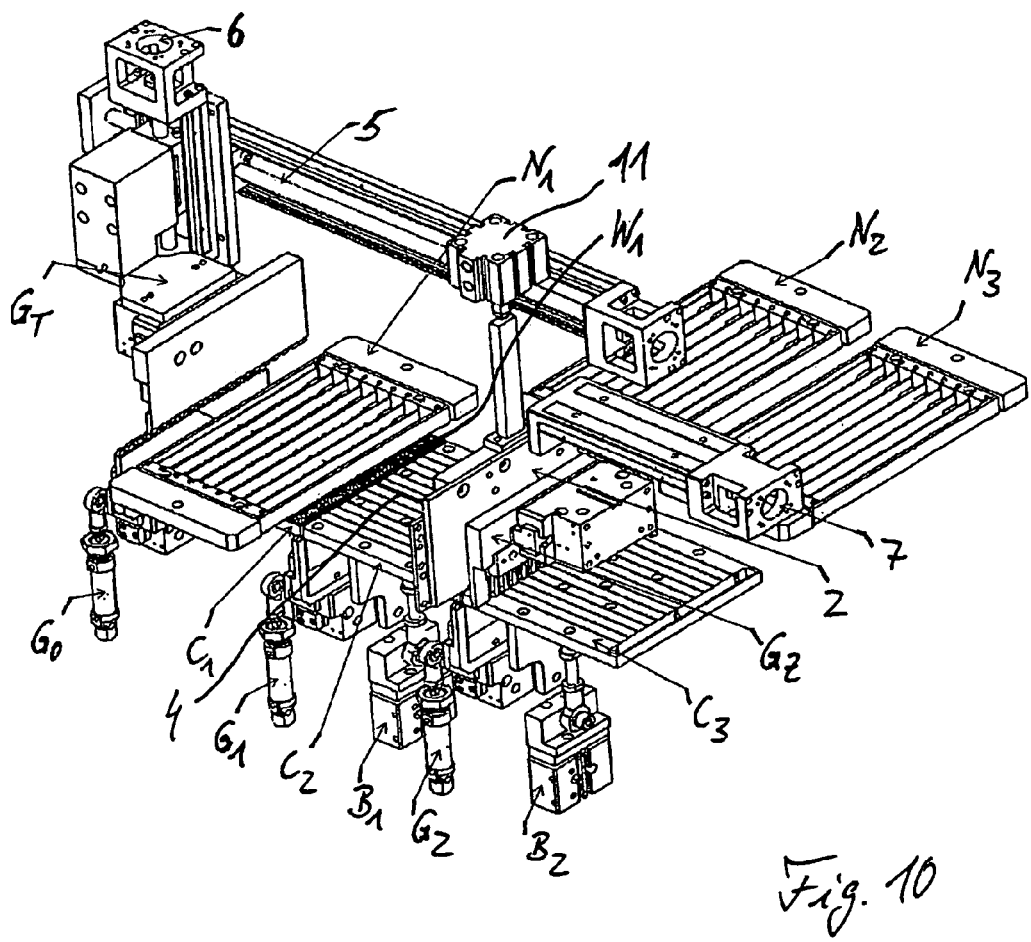
Figure 11:
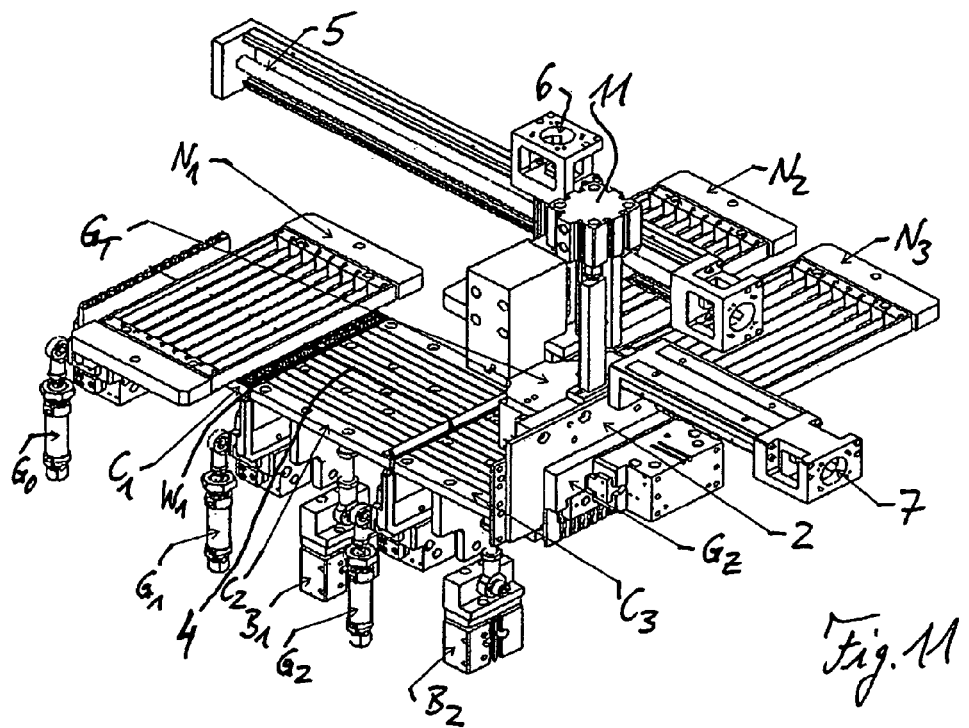
Figure 12:
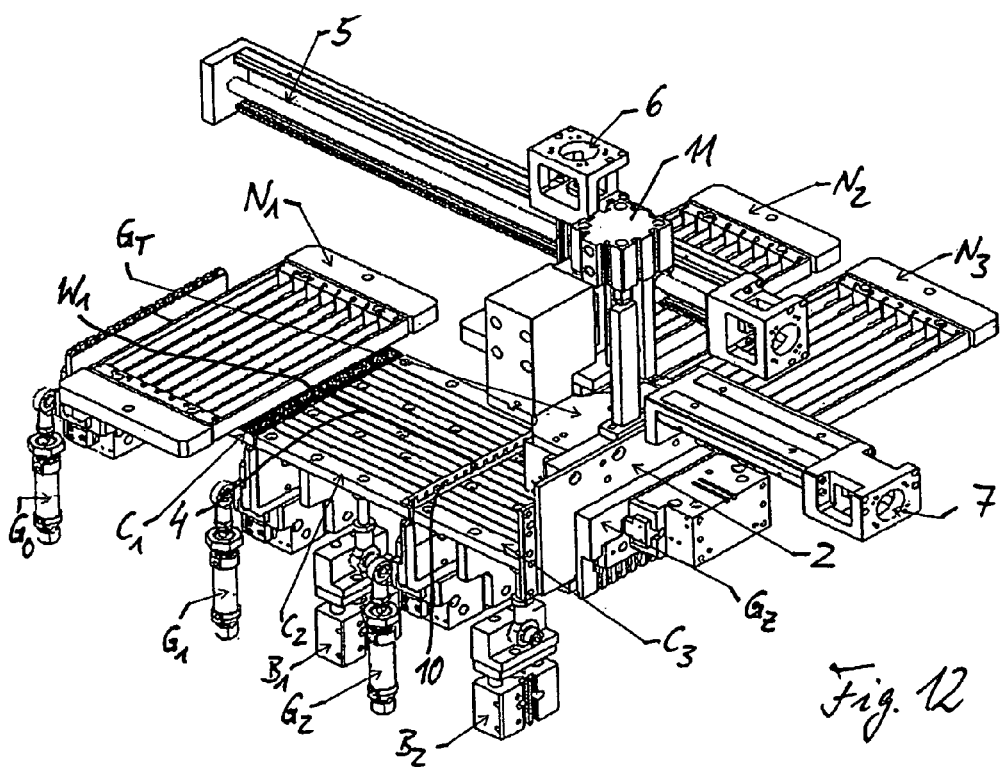

Advantageous embodiments of the invention are illustrated in the drawings and will be described hereinafter. In the drawings:

FIG. 1 shows a schematic side view of a part, essential to the invention, of a device for applying solar cell contact wires providing a series connection, FIG. 2 shows a perspective view of the device from FIG. 1 in a starting position at the start of a wire-laying process, FIG. 3 shows a schematic detailed side view of a part, arranged above a wafer-holding device, of a wire-laying mechanism of the device from FIG. 2, FIG. 4 shows a view corresponding to FIG. 2 once a wire transport gripper has been advanced, FIG. 5 shows a schematic detailed side view similar to FIG. 3 in a wire-cutting stage of the wire-laying process, FIG. 6 shows a view corresponding to FIG. 4 in the wire-cutting stage corresponding to FIG. 5, FIG. 7 shows a perspective detailed view of the transition region between a positioned solar cell wafer and a wafer position which is still unoccupied in order to illustrate wire-bending elements located there, FIG. 8 shows a partial side view of the device according to FIGS. 1 to 7, FIG. 9 shows a detailed longitudinal sectional view of the region from FIG. 7, FIG. 10 shows the perspective view from FIG. 6 in the process stage once a wafer hold-down device has been placed in position, FIG. 11 shows the perspective view from FIG. 10 once the wire transport gripper has been moved back, and FIG. 12 shows the perspective view from FIG. 11 at the end of the wire-laying process.

A part that is of interest in the present case of a device for fitting solar cell contact wires providing a series connection is illustrated schematically in FIG. 1 and can be used to couple a predefinable number n of solar cell wafers mechanically and electrically to form a solar cell string, in which the solar cell wafers are electrically connected in series. To this end, the contact wires run in a string direction, that is to say parallel to the direction in which the solar cell wafers in the string follow one another, continuously on an upper side of a front solar cell wafer and on an underside of a rear solar cell wafer following the front solar cell wafer. In addition, the underside of the foremost solar cell wafer in the string and the surface of the rearmost solar cell wafer in the string are then also overlaid by contact wires. The contact wires may be of any arbitrary cross section, as are usually conventional for this application.

The contact wires provide an electric coupling outwardly for the various regions on the upper side and the underside of each solar cell wafer. To this end, the contact wires themselves may form respective front and rear contact structures or may be contacted with front/rear contact structures already provided on the wafer upper side and the wafer underside. The solar cell wafers may be of any of the usual types that are suitable for this sort of series connection by means of applied contact wires.

As illustrated schematically in FIG. 1, the device according to the invention in this exemplary embodiment includes a wafer-holding device 1 shown in part, here in the form of a conventional wafer table, which can be moved horizontally in the string direction S and on which the solar cell wafers can be positioned in succession in the string direction S in respective wafer-holding positions, which are formed by corresponding vacuum suction support plates $C_1$, $C_2, \ldots C_n$, or what are known as chucks. For example, the solar cell wafers can be placed on the chucks $C_1$ to $C_n$ "sunny-side-up", that is to say with their front contact side pointing downwardly.

Furthermore, the device includes a wire-laying mechanism comprising a wire feed gripper $G_Z$ and a wire transport gripper $G_T$ displaceable in the string direction S relative to the wire feed gripper, said grippers both being arranged above the wafer table 1. In addition, the wire-laying mechanism comprises a wire-holding gripper mechanism, which is arranged beneath the wafer table 1 and which in the shown example comprises a plurality of individual wire-holding grippers $G_0, G_1, \ldots G_n$, as can be seen in greater detail in FIG. 2. The wire-holding grippers $G_0$ to $G_n$ are arranged in front of the foremost chuck $C_1$, in each case between two chucks $C_1$ to $C_n$, and behind a last chuck $C_n$, and are designed to grip and to hold the contact wires in the respective position.

The wire-laying mechanism additionally comprises a wire cutter 2, which in the shown example is formed by two cutting plates 2a, 2b which bear against one another in a plane-parallel manner and are movable relative to one another perpendicular to the string direction S. This relative vertical movement of the two cutting plates 2a, 2b is implemented by a respective vertical drive 11. As can be seen in greater detail in the detailed view of FIG. 3, the cutting plates 2a, 2b are provided with corresponding feedthrough openings 3a, 3b, through each of which a contact wire 4 is passed through when the openings 3a, 3b are in an aligned position. Due to the mutual displacement of the two cutting plates 2a, 2b in their plate plane perpendicular to the string direction S, the feedthrough openings 3a, 3b are displaced relative to one another, whereby the contact wire 4 passed through is severed at this point in each case. As can further be seen from FIG. 3, the feedthrough openings 3a in a feed-side cutting plate 2a have a conically tapering shape, whereas the feedthrough openings 3b in the other, wire-exit-side cutting plate 2b are formed as cylindrical bores.

The device further comprises a hold-down device $N_1$, $N_2, \ldots, N_n$ for each wafer-holding position $C_1$ to $C_n$ in order to hold in position, for a subsequent soldering/fixing process, the contact wires placed on the upper side of the respective solar cell wafer after positioning thereof on the respective chuck $C_1$ to $C_n$.

For displacement along the string direction S, the wire transport gripper $G_T$ is coupled to a respective actuator or a respective displacement axis 5. In addition, it is coupled to a further actuator or a further displacement axis 6, along which it is vertically displaceable, that is to say perpendicularly to the plane of the wafer-holding device 1. In order to move the wire feed gripper $G_Z$ in the string direction S, it is coupled to a corresponding actuator or a corresponding displacement axis 7.

The contact wires providing a series connection are laid down on the upper side of a front wafer and the underside of a next wafer such that, once the front wafer has been positioned and before the next wafer has been positioned on the wafer table 1, the contact wires are placed on the upper side of the positioned front wafer and on the chuck for the next wafer, not yet positioned there. To compensate for the height between the level of the upper side of the front wafer and the chuck for the next wafer or the underside of the next wafer positioned subsequently, the contact wires are bent or deflected suitably in the transition region. To this end, the wire-laying mechanism comprises a wire-bending mechanism comprising wire benders $B_1, \ldots, B_{n-1}$, which are arranged beneath the wafer table 1 in each case in the transition region between two chucks $C_1$ to $C_{n-1}$ beside the wire-holding grippers $G_1$ to $G_{n-1}$ there. The wire-holding grippers $G_0$ to $G_n$ and the wire benders $B_1$ to $B_{n-1}$ are each arranged so as to be vertically movable by means of corresponding actuators.

To control all of the above-mentioned components, the device has a machine controller 8 comprising respective inputs 8a and outputs 8b, as is illustrated merely schematically in FIG. 1. The machine controller is of any type conventional for such machine control purposes and consequently does not require any greater explanations here. In particular, wire-laying control means are implemented in the machine controller 8 and control the components of the wire-laying mechanism so as to carry out a wire-laying process, which will be explained in greater detail hereinafter. A person skilled in the art can implement the wire-laying control means at choice by means of suitable hardware and/or software, which likewise requires no greater explanations here. Alternatively to this integration into the central machine controller 8, the wire-laying control means may also be produced as a separate control unit. In this regard, only the control function of said unit is significant, as will emerge from the following explanations.

The individual steps of a method for fitting solar cell contact wires providing a series connection, as is carried out by a device according to the invention under the control provided by the wire-laying control means 8, will be described in greater detail hereinafter. FIGS. 2 to 12 illustrate successive process stages of this procedure based on the example of the placing of contact wires 4 on the upper side of a foremost solar cell wafer $W_1$ of a solar cell string to be formed and to the Underside of the next, second solar cell wafer in the string. Here, a plurality of parallel contact wires, for example 8 to 20 contact wires, are fitted at the same time, as is known per se from the prior art mentioned in the introduction, wherein, for the sake of clarity, only one of the contact wires 4 is shown in a representative manner in some of the Figures. The contact wires 4 are withdrawn from respective supply reels arranged in a row, as is likewise known per se, and are fitted on the upper side and underside of the solar cell wafers, parallel to the string direction S, with a predefinable transverse spacing, which is dependent on the wafer width and the number of parallel contact wires.

FIG. 2 shows the start of a wire-laying procedure providing a series connection, in which procedure the contact wires 4 are fitted continuously on the upper side of the first solar cell wafer $W_1$, which is already positioned on the first chuck $C_1$, and on the underside of the next solar cell wafer, which is not yet positioned on the respective chuck $C_2$. A series of contact wires is fitted beforehand to the underside of the first wafer $W_1$, wherein the wafer table is located further behind by a wafer length, that is to say by a chuck, such that the first chuck $C_1$ is located where the second chuck $C_2$ is in FIG. 2. To this end, the contact wires are tensioned over the first chuck $C_1$ with the aid of the wire transport gripper $G_T$, are gripped and held by the two respective wire-holding grippers $G_0$ and $C_1$, and are cut off by the wire cutter 2, before the first wafer $W_1$ is positioned thereon. The wafer table 1 is then advanced by a chuck length into the position of FIG. 2. The wire transport gripper $G_T$ returns again to its starting position of FIG. 2, and the first wafer $W_1$ is placed on the first chuck $C_1$ provided with the contact wires.

The wire-laying process for connecting the first wafer $W_1$ in series to the next wafer can then start. To this end the wire feed gripper $G_z$ initially transfers the contact wires 4 fed thereto to the wire transport gripper $G_T$ via their ends. For this purpose, the wire feed gripper $G_z$, which continues to tightly hold the contact wires 4 once these have been cut off in order to overlay the first chuck $C_1$, moves slightly forwards in the string direction S, for example by approximately 10 mm, whereupon the wire transport gripper $G_T$ grips the contact wires 4 at the ends thus becoming accessible thereto and holds them tightly. FIG. 3 shows this transfer process, in which the wire feed gripper $G_z$ approaches the wire cutter 2 and moves the contact wire ends forwards through the wire cutter 2 such that they can be gripped on the other side by the wire transport gripper $G_T$ moved close to the wire cutter 2. In this case, the wire transport gripper $G_T$ is reversed from a wire release position into a wire-clamping position. Conversely, the wire feed gripper $G_z$ is then reversed from its wire-clamping position into its wire release position. The contact wires 4 can now be advanced from the wire transport gripper $G_T$ in the string direction S in a forwards direction by approximately two wafer lengths as far as the front edge of the first solar cell wafer $W_1$, for example by approximately 300 mm.

FIG. 4 shows the device in this process stage. The wire transport gripper $G_T$ is located in an advanced position in front of the first wafer $W_1$. The wire feed gripper $G_z$ is now switched over into its wire-clamping position, and, in order to stretch, that is to say to tension in a drawn manner, the contact wires 4 over the first wafer $W_1$ and the second chuck $C_2$, is moved back by a predefinable stretching length, for example of approximately 30 mm, in the string direction S, that is to say to the right in FIG. 4. The wire feed gripper $G_z$ is then advanced directly by a slight, predefined relaxation length, for example of approximately 1 mm, in the string direction S in order to accordingly relax slightly the stretched contact wires 4.

The wire-holding gripper $G_2$ arranged between the second and the third chuck $C_2$, $C_3$ is now moved vertically upwardly in a wire release position through a gap formed in the wafer table 1 until it takes hold of the tensioned contact wires 4. It is then reversed into a wire-clamping position. In this case, the gap for each wire-holding gripper $G_1$ to $G_{n-1}$ arranged between two chucks is formed in the shown example by a respective slitted transverse opening 9 at the rear end of each chuck $C_1$ to $C_n$. FIG. 5, in a detailed view, shows how the wire-holding gripper $G_2$ passes through the gap 9 at the rear end of the second chuck $C_2$ and tightly holds the tensioned contact wires 4 directly in front of the blade cutter 2.

The wire feed gripper $G_z$ is then reversed into its wire release position and moved back in the string direction S by a predefinable distance length, for example of approximately 19 mm, that is to say away from the wire cutter 2. It is then switched again into its clamping position in order to tightly hold the contact wires 4, fed from the supply reels, on this side of the wire cutter 2. The wire cutter 2 is now activated, whereby the contact wires 4 are cut off in the wire cutter position between the wire transport gripper $G_z$ tightly holding the contact wires 4 on the feed side and the wire-holding gripper $G_2$ tightly holding the contact wires 4 on the other side of the wire cutter 2. This occurs as a result of a relative vertical movement of the two cutting plates 2a, 2b relative to one another, whereby the respective feedthrough openings 3a, 3b in said plates are moved from their aligned position, such that the contact wires 4 passed through are severed there. FIG. 6 shows the device in this process stage.

The wire-holding gripper $G_2$ is then moved back again vertically into its lower position, whereby the contact wires 4 are placed under tension on the upper side of the second chuck $C_2$, wherein the chucks $C_1$ to $C_n$ may have corresponding wire-receiving grooves on their upper sides. On the opposite front edge of the second chuck $C_2$, the wire bender $B_1$ located there is activated, that is to say is moved vertically downwardly from an upper starting position into a wire-fixing position. This means that it grasps the tensioned contact wires 4 in this region by means of hooked-shaped wire-bending elements 10 and entrains said wires from top to bottom until the contact wires 4 transition in an approximately Z-shaped course from the higher level of the upper side of the first wafer $W_1$ positioned on the first chuck $C_1$ to the lower level of the upper side of the second chuck $C_2$. To this end, the respective wire bender $B_1$ to $B_{n-1}$ for each contact wire 4 comprises such a bending element 10, as can be seen from the detailed view of FIG. 7.

The wire benders $B_1$ to $B_{n-1}$ are each located directly beside the corresponding wire-holding gripper $G_1$ to $G_{n-1}$ in the transition region between in each case two chucks $C_1$ to $C_n$, as can be seen in greater detail from the detailed side view of FIG. 8. The respective wire bender $B_1$ to $B_{n-1}$ can thus, by means of its wire-bending elements 10, pass vertically through the same gaps 9 as the respective adjacent wire-holding grippers $G_1$ to $G_{n-1}$, for which purpose the gaps 9, as mentioned, are provided at the rear end region or alternatively at the front end region of each chuck $C_1$ to $C_n$ or between two chucks in each case. The wire bender $B_1$ then fixes, in its wire-fixing position, the contact wires 4 in their bent or deflected transition region from the first wafer $W_1$ to the second chuck $C_2$, as can be seen in a detailed side view from FIG. 9, which shows this region in a later process stage once the second wafer $W_2$ has been placed in position.

The respective wire hold-down device $N_1$ is then placed on the upper side of the first wafer $W_1$ provided with the tensioned contact wires 4. The hold-down device $N_1$ thus fixes the contact wires 4 on the upper side of the first wafer $W_1$. FIG. 10 shows the device in this process stage.

The wire transport gripper $G_T$ can then let loose the contact wires 4 fixed by the hold-down device $N_1$, for which purpose it is reversed into its wire release position. It is then moved vertically upwardly by a predefined distance, for example of 30 mm. The wire transport gripper $G_T$ then reaches a level above the hold-down device $N_1$ and can now be moved back again in the string direction S until behind the wire cutter 2, that is to say by twice the chuck length of approximately 300 mm for example. It is then moved vertically downwardly by the formerly raised distance, for example of 30 mm. The wafer table 1 is then advanced with the device components arranged on the underside, such as the wire hold-down grippers $G_0$ to $G_n$ and the wire benders $B_1$ to $B_{n-1}$, by a chuck length in the string direction S relative to the device components arranged thereabove, that is to say to the left in FIG. 10. FIG. 11 shows the device in this process stage.

To prepare the next wire-laying process, the wire bender $B_2$ arranged between the second and third chuck $C_2$, $C_3$ is then moved vertically upwardly through the respective gap 9 at the rear end region of the second chuck $C_2$. FIG. 12 shows the device in this process stage, in which the first wire-laying procedure providing a series connection for the solar cell string to be formed is complete and the device is ready to carry out the next wire-laying procedure, in which the contact wires are fitted in order to connect in series the upper side of the second wafer $W_2$ to the underside of the third wafer $W_3$. To this end, the second wafer $W_2$ is first placed, in the stage of FIG. 12, on the second chuck $C_2$ provided with the tensioned contact wires 4. The next set of contact wires 4 can then be fitted, this time to the upper side of the positioned second wafer $W_2$ and to the third chuck $C_3$ of the third wafer $W_3$, which is not yet positioned there, as described above with reference to the prior wire-laying procedure.

The same approach is adopted as far as the last wafer $W_n$ of the solar cell string. As a final process of the formation of the solar cell string, the upper side of said last wafer $W_n$ is then also overlaid with the contact wires 4. To this end, the wire transport gripper $G_T$ pulls the contact wires 4 forwards only by a wafer length, and the wire-holding gripper $G_n$ positioned behind the last chuck $C_n$ grips the contact wires 4 behind the wire cutter 2 and pulls them downwardly once they have been cut off. The respective hold-down device $N_n$ is then placed on the upper side of the last wafer $W_n$ provided with the tensioned contact wires 4.

When all wafers $W_1$ to $W_n$ of the solar cell string are positioned in the described manner on their respective chucks $C_1$ to $C_n$ of the wafer table 1 and are overlaid on the upper side and the underside with the contact wires 4 with fixing by the hold-down devices $N_1$ to $N_n$, the contact wires 4 are permanently fixed on the upper sides and undersides of the string wafers $W_1$ to $W_n$ by a conventional fixing process, for example by means of a soldering process, in which the wafers $W_1$ to $W_n$ are moved through a soldering device, such as a soldering furnace, on their chucks $C_1$ to $C_n$ in a continuous operation.

As has been made clear by the above description of advantageous exemplary embodiments, the invention provides a device according to the invention and a method according to the invention with which, by means of a particularly advantageous wire-laying procedure, the contact wires can be fitted to the upper sides and the undersides of solar cell wafers in order to connect in series or contact on the front side and rear side said solar cell wafers, which are to be connected together to form a string.

The invention claimed is:

1. A device for fitting solar cell contact wires providing a series connection, said contact wires running continuously in a string direction on an upper side of a front solar cell wafer and an underside of a rear solar cell wafer following the front solar cell wafer in a solar cell string to be formed, comprising:
   a wafer-holding device, on which the solar cell wafers can be positioned in succession in the string direction in respective wafer-holding positions,
   a wire-laying mechanism having a wire feed gripper and a wire transport gripper movable in the string direction relative to the wire feed gripper, the grippers being arranged above the wafer-holding device, a wire-holding gripper which is designed to grip and to hold the contact wires behind the wafer-holding position for the rear solar cell wafer, and a wire cutter, and
   a wire-laying control device, which controls the wire-laying mechanism to carry out a wire-laying procedure, in which, once the front solar cell wafer has been positioned in its respective wafer-holding position and before the rear solar cell wafer has been positioned in its respective wafer-holding position, the contact wires are transferred from the wire feed gripper to the wire transport gripper, are advanced by the wire transport gripper in the string direction over the wafer-holding position for the rear solar cell wafer and over the upper side of the positioned front solar cell wafer, are gripped and held by the wire-holding gripper behind the wafer-holding position for the rear solar cell wafer, and are then cut off behind the wire-holding gripper by the wire cutter.

2. The device according to claim 1, wherein the wire-laying control device, in order to transfer the contact wires from the wire feed gripper to the wire transport gripper, controls the wire feed gripper from a wire-clamping position into a wire release position and control the wire transport gripper from a wire release position into a wire-clamping position.

3. The device according to claim 1, wherein the wire cutter is arranged between the wire feed gripper and the wire-holding gripper, and the wire-laying control device controls the wire feed gripper from a wire release position into a wire-clamping position, before they activate the wire cutter to cut off the contact wires.

4. The device according to claim 1, wherein the wire cutter includes a feed-side cutting plate arranged perpendicular to the string direction and a second cutting plate bearing against said feed-side cutting plate in a plane-parallel manner, the two cutting plates being displaceable with respect to one another in their plane-parallel plane and being provided with corresponding wire feedthrough openings running in the string direction, of which the wire feedthrough openings of the feed-side cutting plate have a conically tapered shape.

5. The device according to claim 1, wherein the wire-laying mechanism comprises a wire bender which is configured to bend the contact wires, advanced over the wafer-holding position for the rear solar cell wafer and over the upper side of the front solar cell wafer, between the upper side of the front solar cell wafer and the wafer-holding position for the rear solar cell wafer.

6. A method for fitting solar cell contact wires providing a series connection, said contact wires running continuously in a string direction on an upper side of a front solar cell wafer and an underside of a rear solar cell wafer following the front solar cell wafer in a solar cell string to be formed, said method comprising the following steps:
   positioning the front solar cell wafer in a respective wafer-holding position of a wafer-holding device,
   transferring the contact wires from a wire feed gripper arranged above the wafer-holding device to a wire transport gripper,
   advancing the contact wires through the wire transport gripper in the string direction over a wafer-holding position ($C_2$) for the rear solar cell wafer and over the upper side of the positioned front solar cell wafer,
   gripping and holding the contact wires behind the wafer-holding position for the rear solar cell wafer by means of a wire-holding gripper and behind the wire-holding gripper by means of the wire feed gripper, cutting off the contact wires behind the wire-holding gripper and in front of the wire feed gripper by means of a wire cutter, and positioning the rear solar cell wafer in its respective wafer-holding position.

7. The method according to claim 6, wherein, in order to transfer the contact wires from the wire feed gripper to the wire transport gripper, the wire feed gripper is controlled from a wire-clamping position into a wire release position and the wire transport gripper is controlled from a wire release position into a wire clamping position.

8. The method according to claim 6, wherein the contact wires are cut off between the wire feed gripper and the wire-holding gripper and the wire feed gripper is controlled beforehand from a wire release position into a wire-clamping position.

9. The method according to claim 6, wherein the previously moved contact wires between the upper side of the front solar cell wafer and the wafer-holding position for the rear solar cell wafer are bent by means of a wire bender from a level of the upper side of the front solar cell wafer to a level of the wafer-holding position for the rear solar cell wafer.

10. The method according to claim 6, wherein, once the contact wires have been advanced, a hold-down device is placed on the upper side of the front solar cell wafer and holds the contact wires in position there, and the wire transport gripper, once the contact wires have been let loose, is moved back into a position for renewed contact wire transfer from the wire feed gripper.

\* \* \* \* \*